United States Patent
Antoniadis et al.

(10) Patent No.: US 7,489,074 B2
(45) Date of Patent: Feb. 10, 2009

(54) REDUCING OR ELIMINATING COLOR CHANGE FOR MICROCAVITY OLED DEVICES

(75) Inventors: Homer Antoniadis, Mountain View, CA (US); Fabian Doerfel, Senzig (DE)

(73) Assignee: Osram Opto Semiconductors GmbH, Regensburg (DE)

(*) Notice: Subject to any disclaimer, the term of this patent is extended or adjusted under 35 U.S.C. 154(b) by 355 days.

(21) Appl. No.: 10/952,602

(22) Filed: Sep. 28, 2004

(65) Prior Publication Data

US 2006/0066228 A1    Mar. 30, 2006

(51) Int. Cl.
*H01J 1/62* (2006.01)
*H01J 63/04* (2006.01)

(52) U.S. Cl. .................. 313/506; 313/504; 313/503; 313/500; 313/483; 428/917; 428/690

(58) Field of Classification Search ............... 313/506, 313/504, 509
See application file for complete search history.

(56) References Cited

U.S. PATENT DOCUMENTS

| | | | |
|---|---|---|---|
| 5,478,658 | A | 12/1995 | Dodabalapur et al. |
| 5,949,187 | A | 9/1999 | Xu et al. |
| 6,406,801 | B1 | 6/2002 | Tokito |
| 6,490,104 | B1 | 12/2002 | Gleckman |
| 6,767,751 | B2 * | 7/2004 | Hunter ........................ 438/5 |
| 6,861,800 | B2 | 3/2005 | Tyan et al. |
| 6,873,091 | B2 | 3/2005 | Bechtel et al. |

(Continued)

FOREIGN PATENT DOCUMENTS

EP    0 654 833 B1    7/1998

(Continued)

OTHER PUBLICATIONS

R.H. Leach, "The Printing Ink Manual", published by Van Nostrand Reinhold 1988, pp. 394-397.

(Continued)

*Primary Examiner*—Sikha Roy
*Assistant Examiner*—Natalie K Walford
(74) *Attorney, Agent, or Firm*—Cohen Pontani Lieberman & Pavane LLP (57) ABSTRACT

In an embodiment of the invention, a microcavity OLED device that minimizes or eliminates color change at different viewing angles is fabricated. The OLED device can be, for example, an OLED display or an OLED light source used for area illumination. This OLED device includes a multi-layer mirror on a substrate, and each of the layers are comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color.

19 Claims, 9 Drawing Sheets

U.S. PATENT DOCUMENTS

| | | |
|---|---|---|
| 2003/0011306 A1 | 1/2003 | Betchel |
| 2003/0020399 A1 | 1/2003 | Moller |
| 2004/0051447 A1 | 3/2004 | Okinaka |
| 2004/0140757 A1 | 7/2004 | Tyan |

FOREIGN PATENT DOCUMENTS

| | | |
|---|---|---|
| EP | 0 683 623 B1 | 7/1999 |
| EP | 0 801 429 B1 | 9/2003 |
| EP | 1 424 739 A2 | 6/2004 |

OTHER PUBLICATIONS

Shepherd F., "Modern Coating Technology Systems - for paper, film and foil", published by Emap Maclaren Ltd., U.K., 1995 (entire book).

* cited by examiner

REDUCING OR ELIMINATING COLOR CHANGE FOR MICROCAVITY OLED DEVICES

BACKGROUND OF THE INVENTION

An organic light emitting diode ("OLED") display typically includes, in sequence: (1) a substrate made of glass; (2) a transparent anode made of indium tin oxide ("ITO") and the ITO has an index of refraction ("n") of approximately 1.8; (3) a hole transport layer ("HTL") that has "n" of approximately 1.5; (4) an electron transport and light emissive layer ("emissive layer") that has "n" of approximately 1.7; and (5) a cathode. When a forward bias voltage is applied, holes are injected from the anode into the HTL, and the electrons are injected from the cathode into the emissive layer. Both types of carriers are then transported towards the opposite electrode and allowed to recombine with each other in the display, the location of which is called the recombination zone.

Due to the refractive indices of the different layers, and the glass substrate, only a small percentage of the light emitted by the emissive layer is output from the display. One technique to increase the percentage of light output from the display is to use a resonant OLED structure, which is an OLED device that makes use of a microcavity. The mirrors needed to form the microcavity are provided by the metal cathode and a multi-layer stack of non-absorbing materials (e.g., a distributed Bragg reflector ("DBR") stack). The resonant OLED display achieves greater percentage of light output and also greater light intensity thru constructive interference of wavelengths that are in resonance with the microcavity. The wavelength of the light output by the display is determined, in part, by the optical length of the microcavity, which can be manipulated by, for example, changing the thickness of the layers that make up the microcavity.

Unfortunately, microcavity devices have an emission spectrum that undesirably varies as a function of viewing angle from the display. That is, a blue shift in the emitted wavelength (i.e., a shift towards shorter wavelengths) occurs with an increase in the viewing angle from the normal to the emitting surface of the display. In microcavity devices, the distance between standing wave nodes of incident and reflected waves decrease with an increase in viewing angle. Thus, to match the characteristic dimension of the cavity requires shorter wavelengths. Accordingly, the peak emitted wavelength emitted by the microcavity may decrease by about 20 to 45 nm with a 40° shift in viewing angle from the normal to the emitting surface of the display (i.e., the normal to the emitting surface of the display means that the emitted light is viewed at 0° viewing angle). This blue shift limits the use of the resonant OLED structure in a number of important applications, such as displays and traffic lights, where visual perception and impressions are important.

Figure 1:
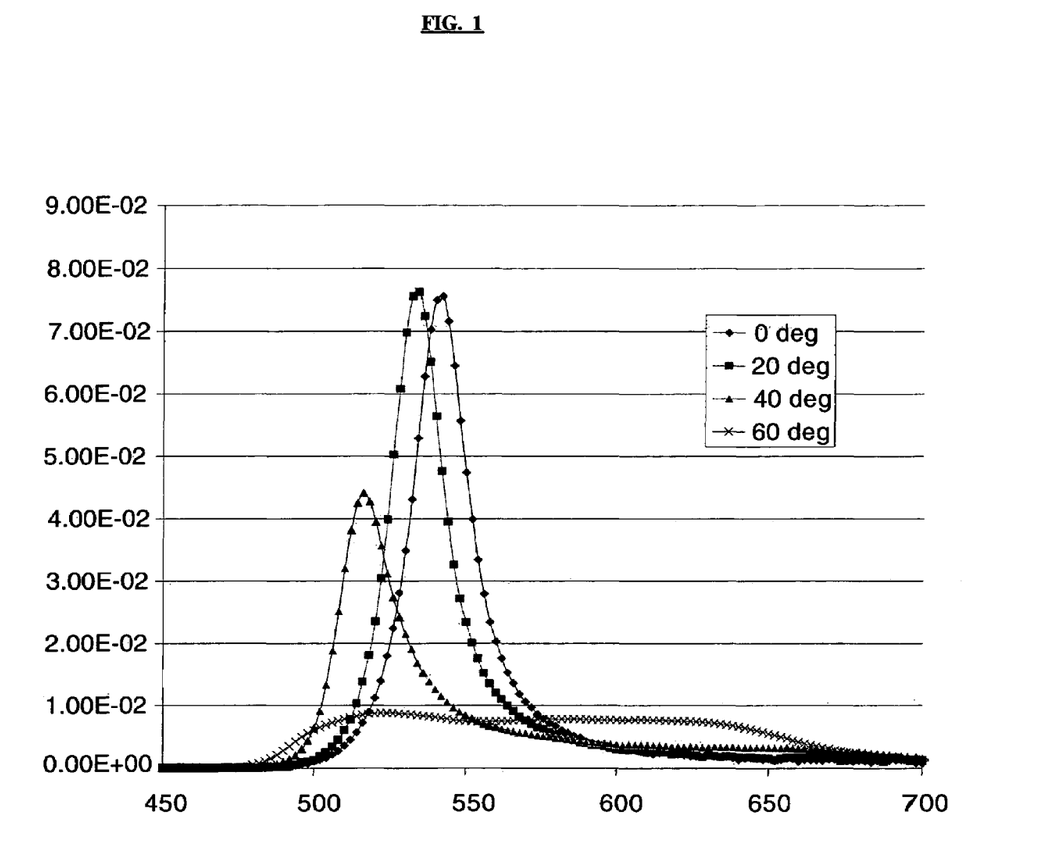
FIG. 1 shows the dependence of color on the viewing angle when a microcavity is used in the OLED display.

FIG. 1 shows the dependence of color on the viewing angle when a microcavity is used in the OLED display. From a viewing angle that is normal to the emitting surface of the display (i.e., viewing angle of 0°), the peak emitted wavelength is at 540 nm. However, at 20° viewing angle, the peak emitted wavelength has blue shifted by about 15 nm. At 40° viewing angle, the blue shift is worse—the peak emitted wavelength has blue shifted by about 25 nm from the peak emitted wavelength at the 0° viewing angle. The blue-shifting results in a perceived color change of the light output by the microcavity OLED display and this color change is unacceptable.

Because of the advantages of using a microcavity such as increased light intensity, increased percentage of light output, and improved color purity, it is desirable to have an OLED device that uses a microcavity but it should be designed to minimize or eliminate the color change due to a change in the viewing angle.

DETAILED DESCRIPTION

In an embodiment of the invention, a microcavity OLED device that minimizes or eliminates color change at different viewing angles is fabricated. The OLED device can be, for example, an OLED display or an OLED light source used for area illumination. This OLED device includes a multi-layer mirror on a substrate, and each of the layers are comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. Other interlayers may also be present to, for example, increase the efficiency of the device. The multi-layer mirror and the second electrode form a microcavity that amplifies a particular wavelength that is in resonance with an optical length of the microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums (i.e., emission spectra) have the same perceived color. Optionally, a circular polarizer can be on a front surface of the light modulation thin film or on a back surface of the light modulation thin film. The circular polarizer minimizes or eliminates ambient light that is reflected within the electronic device.

Figure 2:
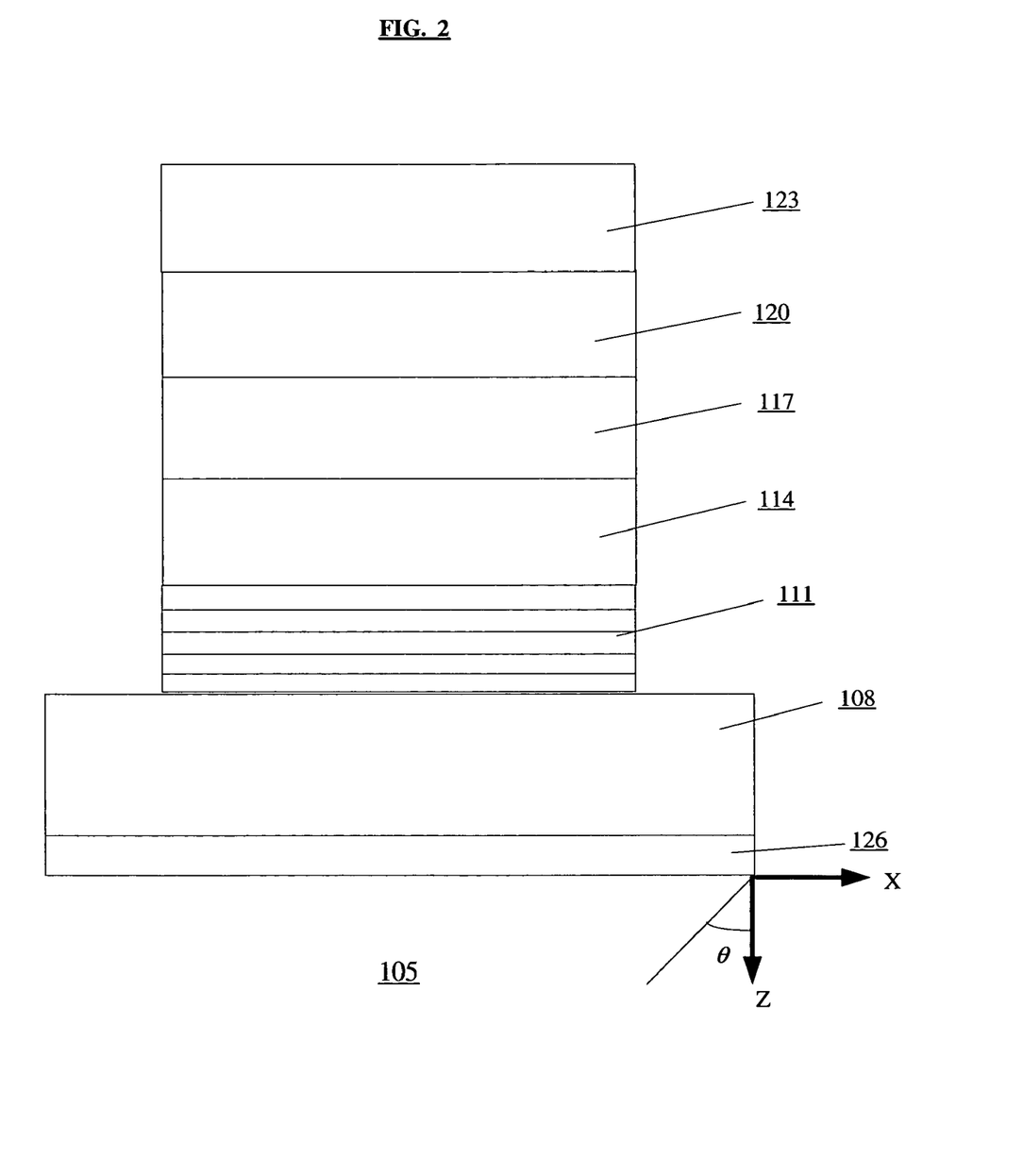
FIG. 2 shows a cross-sectional view of an embodiment of a microcavity OLED device according to the present invention.

FIG. 2 shows a cross-sectional view of an embodiment of a microcavity OLED device 105 according to the present invention. The OLED device 105 can be, for example, an OLED display or an OLED light source used for area illumination. In FIG. 2, a multi-layer mirror 111 is on a substrate 108. As used within the specification and the claims, the term "on" includes when there is direct physical contact between the two parts (e.g., layers) and when there is indirect contact between the two parts because they are separated by one or more intervening parts. Each of the layers of the multi-layer mirror 111 is comprised of a non-absorbing material. The substrate 108 is substantially transparent. A first electrode 114 is on the multi-layer mirror 111. The first electrode 114 is substantially transparent. If the first electrode 114 is an anode, then optionally, a HTL 117 is on the first electrode 114 (this configuration is shown in FIG. 2); otherwise, if a second electrode 123 is the anode, then optionally, the HTL 117 is on an emissive layer 120 (this configuration is not shown). The emissive layer 120 is on the HTL 117 if present and if the first electrode is an anode, otherwise, the emissive layer 120 is on the first electrode 114. A second electrode 123 is on the HTL 117 if present and if the second electrode is an anode, otherwise, the second electrode 123 is on the emissive layer 120. The second electrode 123 is substantially reflective and functions as the other mirror.

The multi-layer mirror 111 and the second electrode 123 together form the microcavity. The microcavity amplifies wavelengths that are near the resonance wavelength and suppresses the other wavelengths. The microcavity in the OLED device increases the percentage of light emitted by the emissive layer that is eventually output from the device, reduces the emission bandwidth and thus improves the color purity of the emitted light, and increases the intensity of the emitted light.

A light modulation thin film 126, is on the front surface of the substrate 108. The light modulation thin film 126 minimizes or eliminates a perceived change in color of the emission spectrum at viewing angles different than 0°.

A viewing angle ("θ") represents an angle from the z-axis; this axis is normal to the light modulation thin film 126. Viewing the emitted light from the normal to the emitting surface of the device means that the emitted light is viewed at 0° viewing angle.

Some of these layers are described in greater detail below.

Substrate 108:

The substrate 108 can be any material, which can support the layers on it. The substrate 108 is substantially transparent. The substrate 108 can be comprised of materials such as, for example, glass, quartz, silicon, or plastic; preferably, the substrate 108 is comprised of thin, flexible glass. The preferred thickness of the substrate 108 depends on the material used and on the application of the device. The substrate 108 can be in the form of a sheet or continuous film. The continuous film is used, for example, for roll-to-roll manufacturing processes which are particularly suited for plastic, metal, and metallized plastic foils.

Multi-Layer Mirror 111:

The multi-layer mirror 111 includes layers of substantially non-absorbing materials of appropriately chosen thickness. In one configuration, the layers of the mirror 111 are alternating pairs of high index and low index thin-films. In another configuration, the mirror 111 is comprised of alternating layers of high index and low index thins films and the mirror 111 has an odd number of layers. The reflectivity of the mirror 111 depends, in part, on the number of layers and the refractive index ("n") of the materials used. The alternating layers can be, for example: $SiO_2$ (n=1.5) and $TiO_2$ (n=2.45); $SiO_2$ and $Si_xN_y$; and $SiO_2$ and $SiN_x$. The multi-layer mirror 111 can be, for example, the DBR stack or a quarter wave stack ("QWS").

First Electrode 114:

The first electrode 114 is substantially transparent. In one configuration of this embodiment, the first electrode 114 functions as an anode (the anode is a conductive layer which serves as a hole-injecting layer and which comprises a material with work function greater than about 4.5 eV). Typical anode materials include metals (such as platinum, gold, palladium, indium, and the like); metal oxides (such as lead oxide, tin oxide, indium tin oxide ("ITO"), and the like); graphite; doped inorganic semiconductors (such as silicon, germanium, gallium arsenide, and the like); and doped conducting polymers (such as polyaniline, polypyrrole, polythiophene, and the like).

In an alternative configuration, the first electrode layer 114 functions as a cathode (the cathode is a conductive layer which serves as an electron-injecting layer and which comprises a material with a low work function). Typical cathode materials are listed below in the section for the "second electrode 123".

The thickness of the first electrode 114 is from about 10 nm to about 1000 nm, preferably, from about 50 nm to about 200 nm, and more preferably, is about 100 nm.

The first electrode layer 114 can typically be fabricated using any of the techniques known in the art for deposition of thin films, including, for example, vacuum evaporation, sputtering, electron beam deposition, or chemical vapor deposition.

HTL 117:

The HTL 117 has a much higher hole mobility than electron mobility and is used to effectively transport holes from the anode. The HTL 117 can be comprised of small molecules or polymers. Examples of suitable small molecule materials are the aromatic amines, diphenyl diamines ("TPD"), or N,N'-di(naphthalene-1-yl)-N,N'-diphenyl-benzidine ("NPB"). Examples of suitable polymers are PEDOT:PSS or polyaniline ("PANI").

The HTL 117 functions as: (1) a buffer to provide a good bond to the first electrode 114; and/or (2) a hole injection layer to promote hole injection; and/or (3) a hole transport layer to promote hole transport.

The HTL 117 can be deposited using selective deposition techniques or nonselective deposition techniques. Examples of selective deposition techniques include, for example, inkjet printing, flex printing, and screen printing. Examples of nonselective deposition techniques include, for example, spin coating, dip coating, web coating, and spray coating.

Emissive Layer 120:

The emissive layer 120 is comprised of a luminescent or fluorescent material where electroluminescence is produced as a result of electron-hole pair recombination in this layer. The emissive layer 120 can be comprised of organic polymers or organic small molecules. Preferably, the organic polymers are fully or partially conjugated polymers. For example, suitable organic polymer materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene) ("TFB"), poly(2,7-(9,9-di-n-octylfluorene)-(1,4-phenylene- ((4-methylphenyl)imino)-1,4-phenylene-((4-methylphenyl) imino)-1,4-phenylene)) ("PFM"), poly(2,7-(9,9-di-n-octylfluorene)-(1,4-phenylene-((4-methoxyphenyl)imino)-1, 4-phenylene)) ("PFMO"), poly (2,7-(9,9-di-n-octylfluorene) ("F8"), (2,7-(9,9-di-n-octylfluorene)-3,6-Benzothiadiazole) ("F8BT"), or poly(9,9-dioctylfluorene).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis (2-methyl-8-hydroxyquinolinato) aluminum; (v) bis(hydroxybenzoquinolinato) beryllium (BeQ.sub.2); (vi) bis (diphenylvinyl)biphenylene (DPVBI); and (vii) arylamine-substituted distyrylarylene (DSA amine).

The thickness of the emissive layer 120 is preferably from about 5 nm to about 500 nm, and more preferably, from about 20 nm to about 100 nm.

The emissive layer 120 comprised of organic polymers or small molecules can be formed using selective deposition techniques or nonselective deposition techniques that are well known to those skilled in the art. For example, the organic polymers can be deposited using selective deposition techniques such as, for example, ink jet printing, flex printing, or screen printing; alternatively, the organic polymers can be deposited using nonselective deposition techniques such as, for example, spin coating, dip coating, web coating, or spray coating. The organic small molecules can be deposited using selective deposition techniques such as, for example, thermal evaporation or sublimation in vacuum using shadow or stencil masks to define the selective areas where the material is to be deposited; alternatively, the organic small molecules can be deposited using nonselective techniques such as, for example, conventional evaporation, sputtering, or chemical vapor deposition.

Second Electrode 123:

The second electrode 123 is substantially reflective and acts as a mirror. The multi-layer mirror 111 and the second electrode 123 together form the microcavity.

In one configuration of this embodiment, the second electrode 123 functions as a cathode. The cathode is typically a multilayer structure that includes, for example, a thin charge injection layer and a thick conductive layer. The charge injection layer has a lower work function than the conductive layer. The charge injection layer can be comprised of, for example, calcium or barium or mixtures thereof. The conductive layer can be comprised of, for example, aluminum, silver, magnesium, alkali fluorides (e.g., lithium fluoride, sodium fluoride, or cesium fluoride), or mixtures thereof.

In an alternative configuration, the second electrode 123 functions as an anode. Typical anode materials are listed earlier in the section for the "first electrode 114".

The thickness of the second electrode 123 is from about 10 nm to about 1000 nm, preferably from about 50 nm to about 500 nm, and more preferably from about 100 nm to about 300 nm.

The second electrode 123 can typically be fabricated using any of the techniques known in the art for deposition of thin films, including, for example, vacuum evaporation, sputtering, electron beam deposition, or chemical vapor deposition.

Light Modulation Thin Film 126:

The light modulation thin film 126 minimizes or eliminates the color change of the emission spectrum at different viewing angles. The light modulation thin film 126 can be any one of: a cut-off color filter, a band-pass color filter, a brightness enhancing film, a microstructure that attenuates an emission spectrum at an angle at which there is a perceived color change, or a microstructure that redistributes wavelengths of an emission spectrum so that there is no perceived color change at different viewing angles.

If the light modulation thin film 126 is a cut-off color filter, then the cut-off color filter, in general, absorbs wavelengths shorter than a cut-off wavelength and transmits the wavelengths longer than the cut-off wavelength. Specifically, in order to minimize or eliminate changes in the perceived color at different viewing angles, the cut-off color filter can do, for example, any of the following: cut-off wavelengths of the emission spectrum that are at a different color than the color of the peak wavelength of the emission spectrum at a 0° viewing angle, cut-off wavelengths that are shorter than a wavelength at which the color begins to differ from the color of the peak wavelength of the emission spectrum at the 0° viewing angle, or significantly reduce the intensities of the wavelengths that are shorter than the wavelength at which the color begins to differ from the color of the peak wavelength of the emission spectrum at the 0° viewing angle. The color change can begin to occur when the hue of the color changes. The hue change as used herein, refers to an intermediate change in a color such as, for example, a change from deep green at about 540 nm to blue-green at about 505 nm.

The cut-off color filter can be a sheet that is laminated onto the substrate 108. The process of lamination can be a dry lamination process using, for example, heat; a wet lamination process using waxes or adhesives; or an extrusion process. Some examples of lamination techniques are given in "The Printing Ink Manual" by R. H. Leach, published by Van Nostrand Reinhold, 1988, pp 394-397, or in "Modern Coating Technology Systems—for Paper, Film and Foil" by F. Shepherd, published by Emap Maclaren Ltd, UK, 1995.

Figure 3:
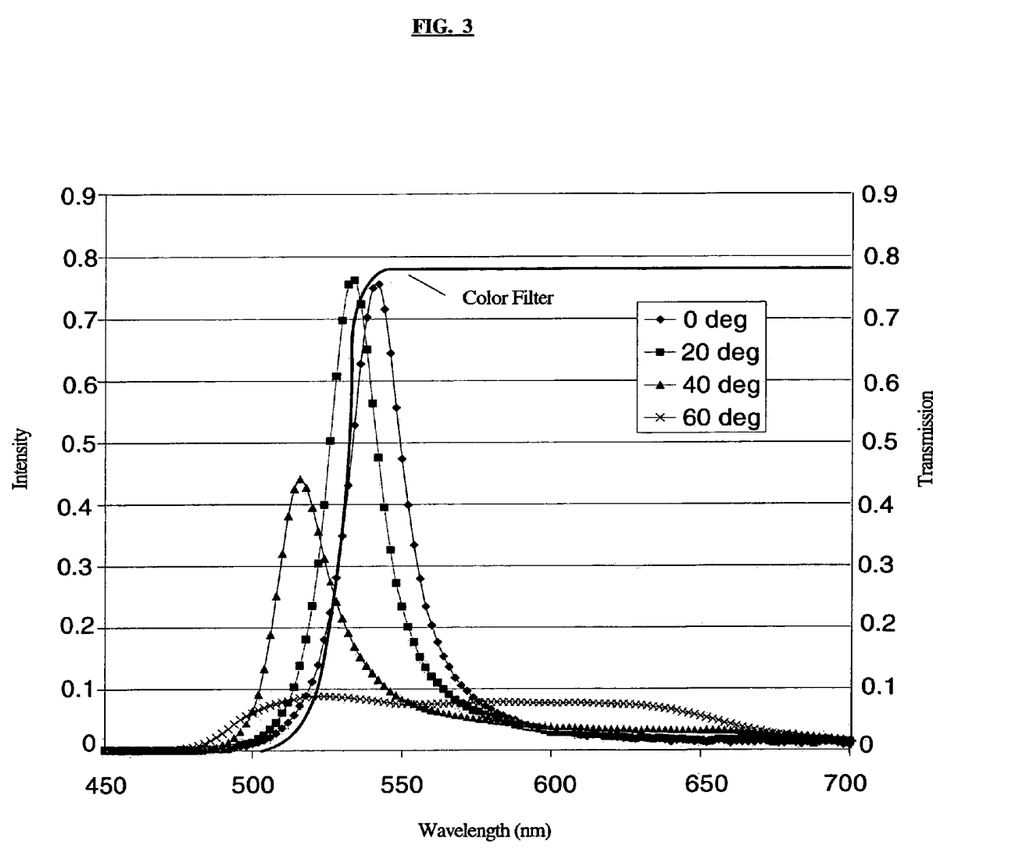
FIG. 3 graphically shows a prospective example of the wavelengths that are transmitted and absorbed by the cut-off color filter in order to reduce or eliminate the color change at different viewing angles.

FIG. 3 graphically shows a prospective example of the wavelengths that are transmitted and absorbed by the cut-off color filter in order to reduce or eliminate the color change at different viewing angles. In FIG. 3, the cut-off color filter absorbs the wavelengths that are shorter than the cut-off wavelength (the cut-off wavelength is approximately 530 nm), and transmits the wavelengths that are longer than the cut-off wavelength. The change in color at large viewing angles is eliminated because wavelengths where the color differs from the color of the peak emitted wavelength at 0° viewing angle are absorbed by the cut-off color filter. For example, in FIG. 3, the cut-off color filter does not transmit the wavelengths where the color hue is blue-green (e.g., around 505 nm) and thus the intermediate blue-green color is not seen at any of the viewing angles and therefore there is no perceived color change at the larger viewing angles.

Alternatively, if the light modulation thin film 126 is a band-pass color filter (e.g., this filter can be an inorganic band-pass filter (e.g., a dichroic filter) or an organic band-pass filter), then the band-pass color filter, in general, transmits only a narrow band of wavelengths while absorbing wavelengths that are outside the narrow band. Specifically, in order to minimize or eliminate changes in the perceived color at different viewing angles, the narrow band of wavelengths transmitted by the band-pass color filter are, for example, only those wavelengths that are the same color as the color of the peak wavelength of the emission spectrum at a 0° viewing angle. Preferably, the band-pass color filter only transmits those wavelengths that are of the same hue as the peak wavelength of the emission spectrum at the 0° viewing angle.

The band-pass color filter can be a sheet that is laminated onto the substrate 108.

Figure 4:
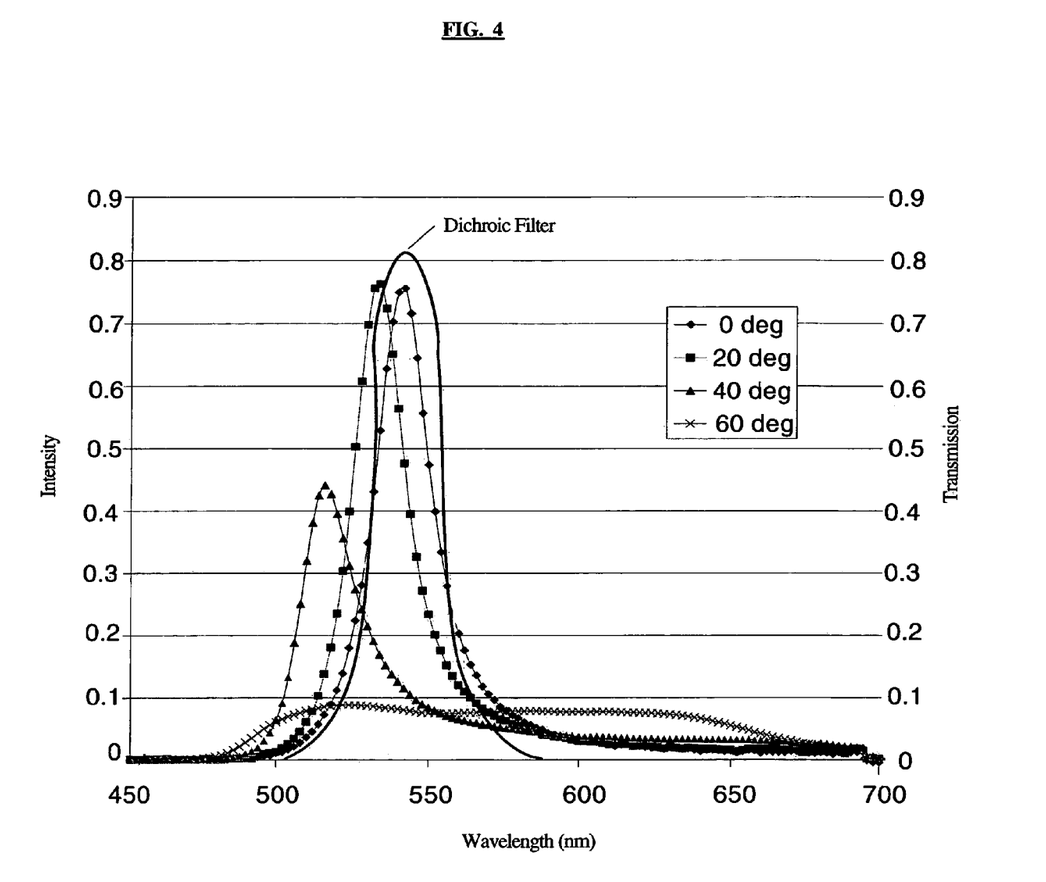
FIG. 4 graphically shows a prospective example of the narrow band of wavelengths that are transmitted by the band-pass color filter in order to reduce or eliminate the color change at different viewing angles.

FIG. 4 graphically shows a prospective example of the narrow band of wavelengths that are transmitted by the band-pass color filter in order to reduce or eliminate the color change at different viewing angles. In FIG. 4, the band-pass color filter transmits wavelengths between the narrow band of about 525 nm and about 555 nm. By allowing only the transmission of wavelengths that are of the same color as the color of the peak emitted wavelength at 0° viewing angle, the perceived change in color at the large viewing angles is eliminated. For example, the wavelengths where the color hue changes from the deep-green at the peak emitted wavelength at 0° viewing angle to the blue-green at about 505 nm is not in the narrow band of wavelengths that are transmitted and so is not output by the microcavity device and thus there is no perceived color change at the larger viewing angles.

Alternatively, if the light modulation thin film 126 is a brightness enhancing film ("BEF"), then the BEF, in general, refracts wavelengths at certain allowed angles while internally reflecting wavelengths at the other angles. The reflected wavelengths are recycled until they exit at the allowed angles and the recycling increases the intensity of the wavelengths at the allowed angles. Specifically, in order to minimize or eliminate changes in the perceived color output by the microcavity device at different viewing angles, the BEF can refract the emission spectrums at angles at which there is no perceived color change, and internally reflect the emission spectrums that are at angles at which there is a perceived color change. By using the BEF, the emission spectrums at the allowed angles have a greater intensity than without the BEF while the emission spectrums at the angles where there is a perceived color change are eliminated resulting in brighter light output at the allowed viewing angles while there is no light or only trace amounts of light at the other viewing angles. Preferably, the perceived color changes if the perceived color of the emission spectrum at the particular viewing angle has a different hue than the perceived color of the emission spectrum at the 0° viewing angle.

The BEF is commercially available from, for example, the 3M Corporation in Minnesota under the VIKUITI brand. The BEF can be laminated onto the substrate 108.

Figure 5:
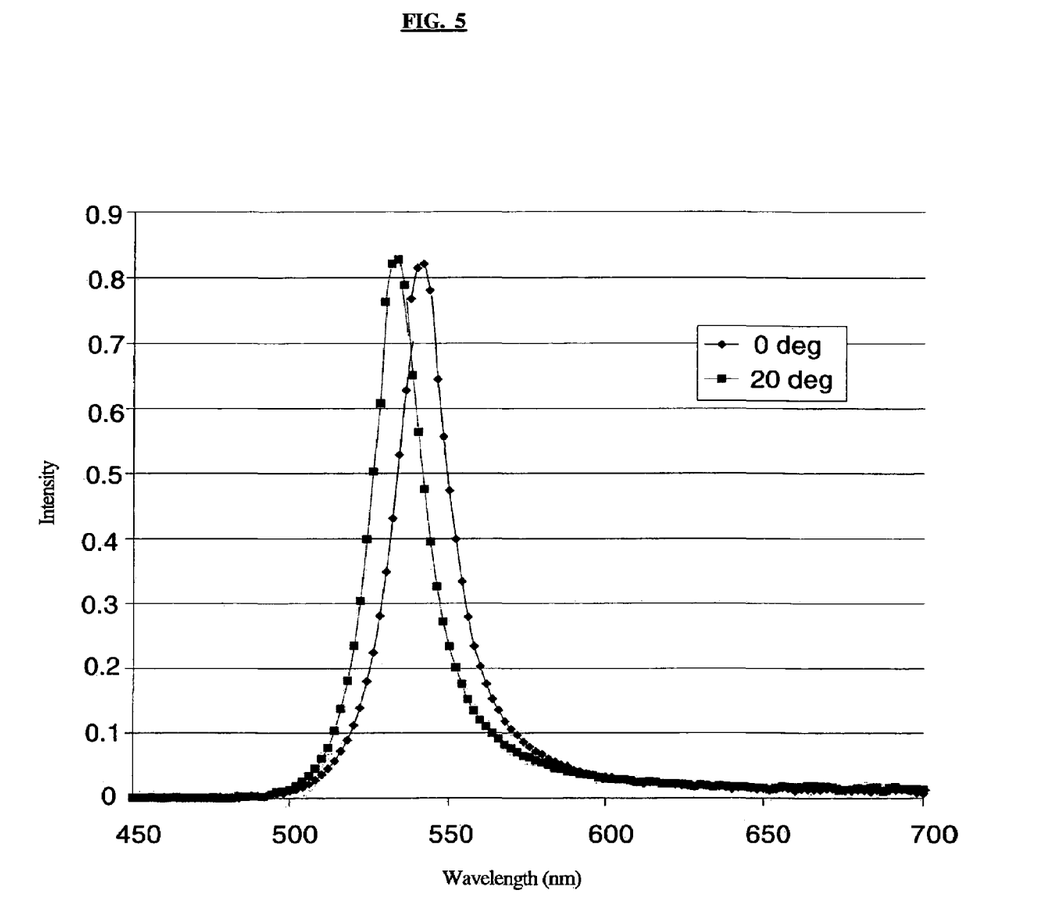
FIG. 5 graphically shows a prospective example of the resulting emission spectrums when a brightness enhancing film is used to reduce or eliminate the color change at different viewing angles.

FIG. 5 graphically shows a prospective example of the resulting emission spectrums when the BEF is used to reduce or eliminate the color change at different viewing angles. The BEF refracts wavelengths at angles less than 30° but internally reflects wavelengths at angles greater than 30° and thus the emission spectrums at the viewing angles greater than 30° are eliminated (e.g., the emission spectrum at the 40° viewing angle and the emission spectrum at the 60° viewing angle have been eliminated). Because of the greater blue-shifting occurring at the larger viewing angles (e.g., the 40° and the 60° viewing angles) and thus the greater likelihood that the perceived color will change at these larger angles, the elimination of the emission spectrums at these larger viewing angles greatly reduces the likelihood that there will be a perceived color change at different viewing angles. Because the internally reflected wavelengths are recycled until it exits at the allowed angles, the wavelengths of the emission spectrums at the allowed viewing angles have greater intensity than without the BEF.

Alternatively, if the light modulation thin film 126 is a microstructure, then the microstructure can transmit the emission spectrums that are at the allowed angles while attenuating the emission spectrums that are at other angles. This occurs by, for example, adjusting focal lengths of lenses so that wavelengths with angles of incidence higher than the allowed angles are not focused, but rather are internally reflected within the substrate. The internally reflected wavelengths are redirected so that they are randomly output from the device at the allowed angles. The random output of the wavelengths at the allowed angles broadens the emission spectrums at the allowed angles. Specifically, in order to minimize or eliminate changes in the perceived color output by the microcavity device at different viewing angles, the microstructure can refract the wavelengths of the emission spectrums at angles at which there is no perceived color change, and attenuate (e.g., by internally reflecting) the wavelengths of the emission spectrums that are at angles at which there is a perceived color change. For example, there is a perceived color change if the outputted emission spectrum has a different hue than the emission spectrum at the 0° viewing angle. The reflected wavelengths are randomly output by the device at the allowed angles and thus the emission spectrums at the allowed angles are broader. There are no wavelengths outputted or only a very small number at the angles greater than the angle at which there is a perceived color change.

Figure 6:
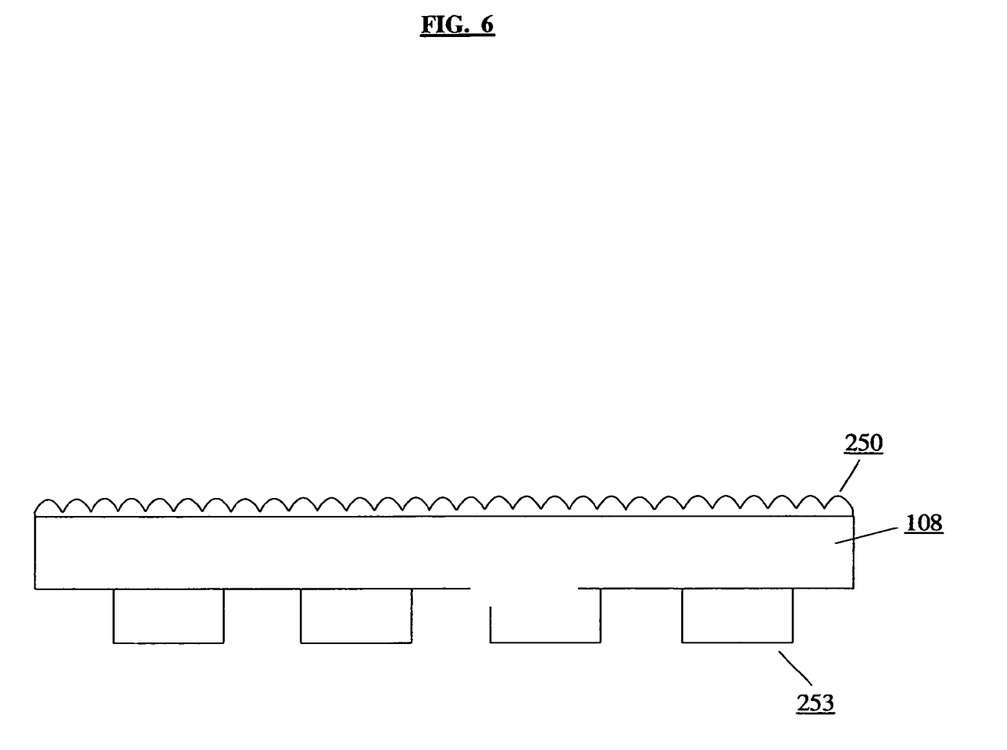
FIG. 6 shows a microlens array attached to a substrate according to the present invention.

The microstructure can be a random optical microstructure array or a periodic optical microstructure array. For example, more specifically, the microstructure can be, e.g., a microlens array. FIG. 6 shows a microlens array 250 attached to the substrate 108 according to the present invention. The microlens array 250 is on the front surface of the substrate 108 and multiple microcavity OLED devices 253 are on the back surface of the substrate 108. Each of the microlenses can be any of a variety of shapes. The microlens array 250 can have a lens density of from about 5,000 to about 1,000,000 lenses per square millimeter. The microlens array 250 can be made of, for example, glass or a polymeric material. The substrate can be a micro-patterned lenslet array, or alternatively, the substrate and the microlens array are formed separately and the microlens array is laminated onto the substrate. The microlens array 250 can be laminated to the substrate 108 by, for example, physical bonding (e.g., thermal adhesion) or chemical bonding (e.g., gluing).

Figure 7:
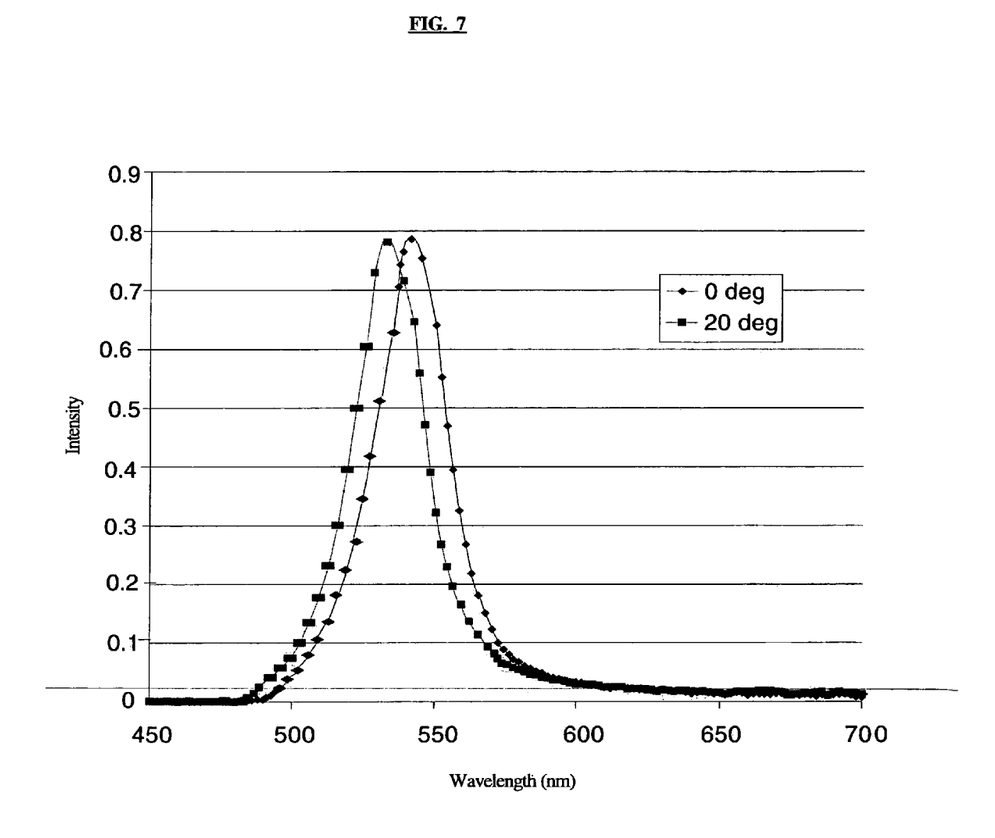
FIG. 7 graphically shows a prospective example of the resulting emission spectrums when a first embodiment of the microstructure is used to reduce or eliminate the color change at different viewing angles.

FIG. 7 graphically shows a prospective example of the resulting emission spectrums when a first embodiment of the microstructure is used to reduce or eliminate the color change at different viewing angles. The microstructure refracts wavelengths at angles less than 30° but internally reflects wavelengths at angles greater than 30° and thus the emission spectrums at the viewing angles greater than 30° are eliminated (e.g., the emission spectrum at the 40° viewing angle and the emission spectrum at the 60° viewing angle have been eliminated). Because of the greater blue-shifting occurring at the larger viewing angles (e.g., the 40° and the 60° viewing angles) and thus the greater likelihood that the perceived color will change at these larger angles, the elimination of the emission spectrums at these larger viewing angles greatly reduces the likelihood that there will be a perceived color change at different viewing angles. Because the internally reflected wavelengths are randomly outputted at the allowed angles, the emission spectrums at the allowed viewing angles are broader than without the microstructure.

Alternatively, if the light modulation thin film 126 is a microstructure, then the microstructure can allow more wavelengths to be extracted from the substrate and also redistribute the wavelengths so that the outputted emission spectrums are broader and there is less perceived color change at different viewing angles. For example, variable and random lens focal lengths can be used to redistribute the wavelengths so that the outputted emission spectrums are broader and there is less blue-shifting at the larger viewing angles. The presence of the microstructure expands the escape cone of the substrate and so wavelengths are outputted from the device that would otherwise be wave guided without the presence of the microstructure. Thus, the presence of the microstructure can increase the intensity of the emission spectrums that are outputted. Specifically, in order to minimize or eliminate changes in the perceived color output by the microcavity device at different viewing angles, the microstructure can redistribute the wavelengths so that the outputted emission spectrums are broader and there is no perceived color change at the different viewing angles. For example, there is no perceived color change at a viewing angle different than 0° if the perceived color at that viewing angle has the same hue as the perceived color of the emission spectrum at the 0° viewing angle. The microstructure can be, for example, the microlens array described earlier, or a randomly textured surface (e.g., valleys and peaks of random amplitudes).

Figure 8:
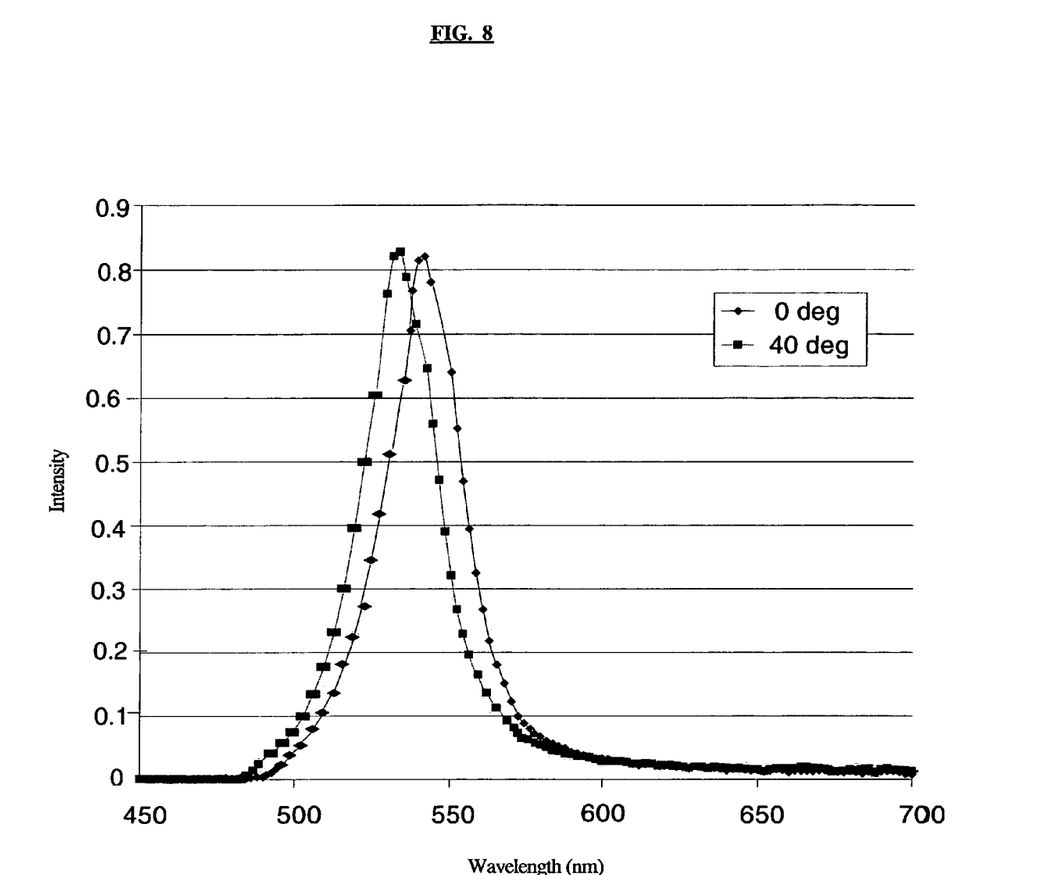
FIG. 8 graphically shows a prospective example of the resulting emission spectrums when a second embodiment of the microstructure is used to reduce or eliminate the color change at different viewing angles.

FIG. 8 graphically shows a prospective example of the resulting emission spectrums when a second embodiment of the microstructure is used to reduce or eliminate the color change at different viewing angles. The microstructure redistributes the wavelengths so that the outputted emission spectrums are broader and there is no perceived color change at the different viewing angles. The intensity of the wavelengths of the emission spectrums are increased due to the presence of the microstructure. In FIG. 8, the emission spectrum at the 0° viewing angle has a peak emitted wavelength at about 540 nm which is a dark green color. Similarly, the emission spectrum at the 40° viewing angle has a peak emitted wavelength at about 533 nm which is also the dark green color. The intensity is insignificant at the wavelengths of both emission spectrums where there is a different hue (e.g., at a wavelength of about 505 nm, the color is a blue-green color) and so both emission spectrums have the same perceived color which is the dark green color.

Optionally, the microcavity OLED device 105 may also include a circular polarizer. The circular polarizer suppresses reflections that occur within the device (i.e., specular reflections). The circular polarizer can be a composite structure that include, for example, a linear polarizer and a quarter wave plate. Ambient light first reaches the linear polarizer and then passes through the quarter wave plate. If this light is reflected within the device (e.g., at the reflecting cathode), then the quarter wave plate is passed twice resulting in the plane of polarization being rotated 90 degrees with respect to the original orientation. The linear polarizer then blocks the return light thus eliminating reflections. The circular polarizer can be placed on either the front surface of the light modulation thin film 126 or the back surface of the light modulation thin film 126. Preferably, the circular polarizer is placed on the side where it does not interfere with the modulation function of the light modulation thin film 126. For example, preferably, the circular polarizer is placed on the back surface of the light modulation thin film 126, i.e., the circular polarizer is between the substrate 108 and the light modulation thin film 126. Alternatively, in some cases such as the case of the cut-off color filter, both the cut-off color filter and the circular polarizer can be integrated in a single layer.

Figure 9:
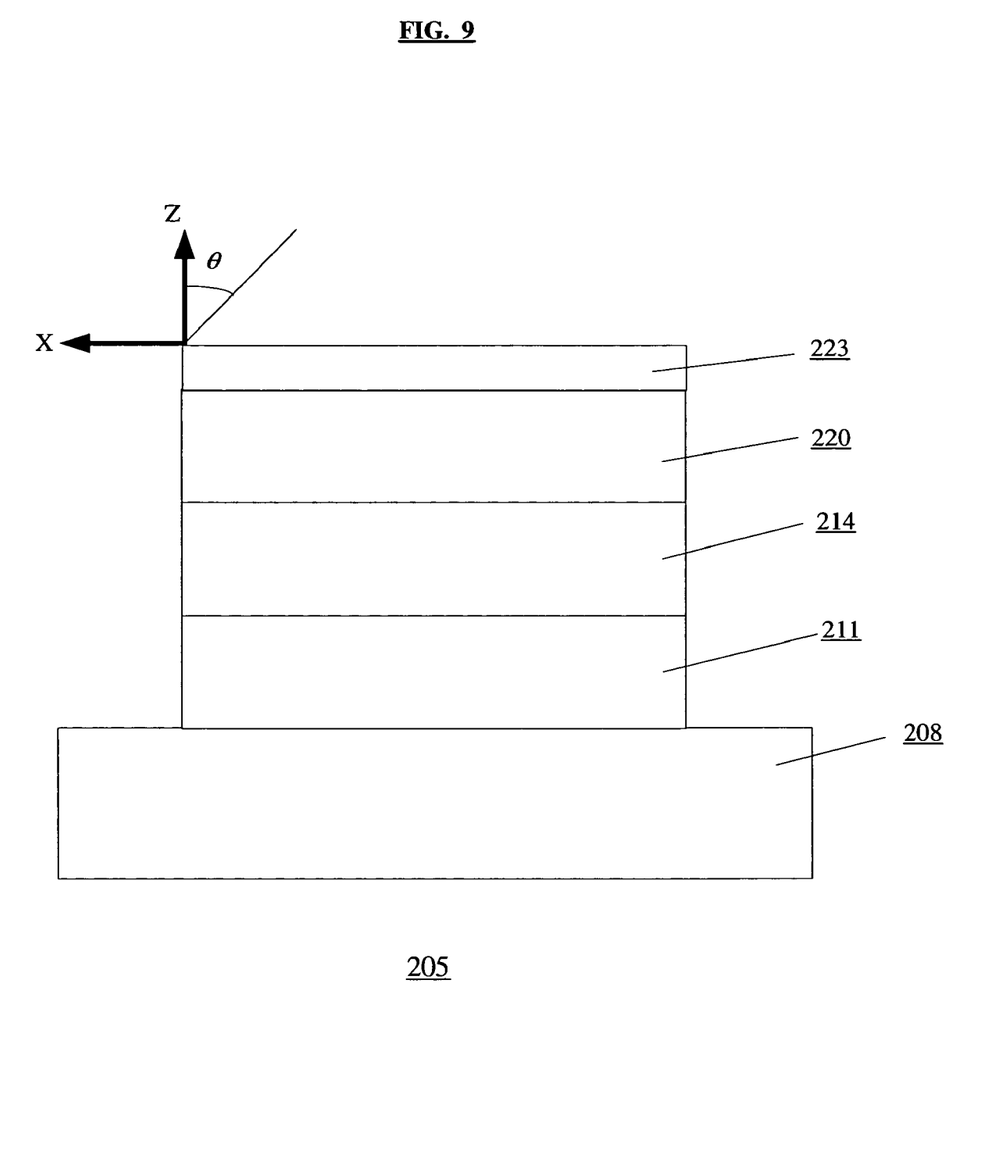
FIG. 9 shows a cross-sectional view of an embodiment of a top-emitting microcavity OLED device according to the present invention.

Alternatively, rather than emitting light from the bottom, the microcavity OLED device can emit light from the top of the device. FIG. 9 shows a cross-sectional view of an embodiment of a top-emitting microcavity OLED device 205 according to the present invention. The OLED device 205 is top-emitting. In FIG. 9, a first electrode 211 is on a substrate 208. The first electrode 211 is substantially reflective and functions as a mirror. The substrate 208 can be either substantially transparent or substantially reflective. The emissive layer 214 is on the first electrode 211. A second electrode 220 is on the emissive layer 214. The second electrode 220 is substantially transparent but also provides some reflectance. The first electrode 211 and the second electrode 220 together can form a microcavity. A light modulation thin film 223 is on the second electrode 220. The light modulation thin film 223 can be any of the five devices described earlier. The light modulation thin film 223 reduces or eliminates a change in color at different viewing angles. A buffer layer may be present between the second electrode 220 and the light modulation thin film 223; the buffer layer can be used to, for example, facilitate lamination of the second electrode 220 to the device or improve the bonding between the light modulation thin film 223 and the device. The viewing angle ("θ") represents an angle from the z-axis; this axis is normal to the light modulation thin film 223.

The OLED devices described earlier can be used in applications such as, for example, computer displays, information displays in vehicles, television monitors, telephones, printers, illuminated signs, and light sources.

As any person of ordinary skill in the art of electronic device fabrication will recognize from the description, figures, and examples that modifications and changes can be made to the embodiments of the invention without departing from the scope of the invention defined by the following claims.

What is claimed:

1. A microcavity OLED device that minimizes or eliminates color change at different viewing angles, comprising:
 a substrate having a front surface and a back surface;
 a light modulation thin film on said front surface of said substrate;
 a multi-layer mirror on said back surface of said substrate, wherein said multi-layer mirror is comprised of a plurality of layers, each of said plurality of layers is comprised of a non-absorbing material;
 a first electrode on said multi-layered first mirror, wherein said first electrode is substantially transparent;
 an emissive layer on said first electrode; and
 a second electrode on said emissive layer,
 wherein said second electrode is a mirror,
 wherein said multi-layer mirror and said second electrode form a microcavity that amplifies a particular wavelength that is in resonance with an optical length of said microcavity
 wherein said microcavity has an emission spectrum that changes in color as a function of a viewing angle, and
 wherein said light modulation thin film minimizes or eliminates said color change of said emission spectrum of said microcavity at different viewing angles.

2. The OLED device of claim 1 wherein said light modulation thin film is a cut-off color filter that cuts-off wavelength of said emission spectrum that are shorter than a wavelength at which a color begins to differ from a color of a peak emitted wavelength of said emission spectrum at a 0° viewing angle.

3. The OLED device of claim 1 wherein said light modulation thin film is a band-pass color filter that allows only wavelengths of said emission spectrum that are a same color as a color of a peak emitted wavelength of said emission spectrum at a 0° viewing angle to pass therethrough.

4. The OLED device of claim 1 wherein said light modulation thin film is a brightness enhancing film that allows only wavelengths of said emission spectrum that are at an angle at which a perceived color is the same as a perceived color of said emission spectrum at a 0° viewing angle to pass therethrough.

5. The OLED device of claim 4 wherein said brightness enhancing film internally reflects said emission spectrum at an angle at which said perceived color differs from said perceived color of said emission spectrum at said 0° viewing angle.

6. The OLED device of claim 1 wherein said light modulation thin film is a microstructure that attenuates an emission spectrum at an angle at which a perceived color of said emission spectrum differs from a perceived color of said emission spectrum at a 0° viewing angle.

7. The OLED device of claim 6 wherein wavelengths of said attenuated emission spectrum are redirected to said emission spectrum at an angle at which said perceived color is the same as said perceived color of said emission spectrum at said 0° viewing angle.

8. The OLED device of claim 7 wherein said redirected wavelengths broaden said emission spectrum at an allowed angle.

9. The OLED device of claim 6 wherein said microstructure transmits said emission spectrum at an angle at which said perceived color is the same as said perceived color of said emission spectrum at said 0° viewing angle.

10. The OLED device of claim 6 wherein said microstructure is a plurality of micro lenses.

11. The OLED device of claim 1 wherein said light modulation thin film is a microstructure that redistributes wavelengths of an emission spectrum at a viewing angle so a perceived color of said emission spectrum is the same as a perceived color of said emission spectrum at a 0° viewing angle.

12. The OLED device of claim 11 wherein said microstructure increases the number of wavelengths extracted from said substrate.

13. The OLED device of claim 11 wherein redistributing said wavelengths results in said emission spectrum being broader.

14. The OLED device of claim 11 wherein said microstructure increases intensities of said wavelengths of said emission spectrum.

15. The OLED device of claim 11 wherein said microstructure is a plurality of microlenses.

16. The OLED device of claim 1 further comprising a circular polarizer that is either: (1) on a front surface of said light modulation thin film, or (2) on a back surface of said light modulation thin film such that it is between said light modulation thin film and said substrate, wherein said circular polarizer suppresses specular reflections occurring within said device.

17. The OLED device of claim 16 wherein said circular polarizer is on a side of said light modulation thin film where said circular polarizer does not interfere with a modulation function of said light modulation thin film.

18. The OLED device of claim 1 wherein a circular polarizer is integrated within said light modulation thin film.

19. The OLED device of claim 1 wherein said device is an OLED display or an OLED light source used for area illumination.

* * * * *